United States Patent
Osumi et al.

(10) Patent No.: US 11,939,443 B2
(45) Date of Patent: Mar. 26, 2024

(54) POLYPHENYLENE ETHER RESIN COMPOSITION, PREPREG, METAL-CLAD LAMINATE

(71) Applicant: NIPPON SODA CO., LTD., Tokyo (JP)

(72) Inventors: Shota Osumi, Chiba (JP); Izumi Tando, Chiba (JP); Hiroki Ueda, Chiba (JP); Yoshio Hayakawa, Chiba (JP)

(73) Assignee: NIPPON SODA CO., LTD., Tokyo (JP)

( * ) Notice: Subject to any disclaimer, the term of this patent is extended or adjusted under 35 U.S.C. 154(b) by 53 days.

(21) Appl. No.: 17/632,067

(22) PCT Filed: Jul. 7, 2020

(86) PCT No.: PCT/JP2020/026565
§ 371 (c)(1),
(2) Date: Feb. 1, 2022

(87) PCT Pub. No.: WO2021/024679
PCT Pub. Date: Feb. 11, 2021

(65) Prior Publication Data
US 2022/0251376 A1   Aug. 11, 2022

(30) Foreign Application Priority Data

Aug. 6, 2019 (JP) ................. 2019-144191
Feb. 27, 2020 (JP) ................. 2020-031772

(51) Int. Cl.
| | | |
|---|---|---|
| C08J 5/24 | (2006.01) |
| B32B 5/02 | (2006.01) |
| B32B 15/12 | (2006.01) |
| B32B 15/14 | (2006.01) |
| B32B 15/20 | (2006.01) |
| C08L 53/02 | (2006.01) |
| C08L 71/12 | (2006.01) |

(52) U.S. Cl.
CPC ............... *C08J 5/244* (2021.05); *B32B 5/02* (2013.01); *B32B 5/022* (2013.01); *B32B 15/12* (2013.01); *B32B 15/14* (2013.01); *B32B 15/20* (2013.01); *C08L 53/02* (2013.01); *C08L 71/12* (2013.01); *B32B 2260/021* (2013.01); *B32B 2260/023* (2013.01); *B32B 2260/028* (2013.01); *B32B 2260/046* (2013.01); *B32B 2262/0269* (2013.01); *B32B 2262/0276* (2013.01); *B32B 2262/101* (2013.01); *B32B 2307/204* (2013.01); *B32B 2307/306* (2013.01); *B32B 2307/308* (2013.01)

(58) Field of Classification Search
CPC . C08J 5/244; B32B 5/02; B32B 5/022; B32B 15/12; B32B 15/14; B32B 15/20; B32B 2260/021; B32B 2260/028; B32B 2260/046; B32B 2262/0269; B32B 2262/0276; B32B 2262/101; B32B 2307/204; B32B 2307/306; B32B 2307/308; C08L 71/12; C08L 53/02
USPC ....................................... 442/378
See application file for complete search history.

(56) References Cited

U.S. PATENT DOCUMENTS

| | | |
|---|---|---|
| 5,571,609 A | 11/1996 | St. Lawrence et al. |
| 6,376,606 B1 | 4/2002 | Adedeji |
| 10,093,800 B2 | 10/2018 | Zeng |
| 2006/0094815 A1* | 5/2006 | Kunisawa ............... C08L 21/00 524/496 |
| 2006/0177666 A1 | 8/2006 | Kawabe |
| 2007/0060677 A1 | 3/2007 | Yoshida et al. |
| 2013/0116376 A1 | 5/2013 | Custodero et al. |
| 2014/0200294 A1* | 7/2014 | Furukawa ............... C08L 71/10 524/127 |
| 2015/0140296 A1 | 5/2015 | Matsushima et al. |
| 2016/0145370 A1 | 5/2016 | Kitai et al. |
| 2018/0134842 A1* | 5/2018 | Nagai ..................... C08L 25/08 |
| 2021/0307164 A1 | 9/2021 | Yin et al. |

FOREIGN PATENT DOCUMENTS

| | | |
|---|---|---|
| CN | 1227855 A | 9/1999 |
| CN | 102947381 | 2/2013 |
| JP | 2006-516297 | 6/2006 |
| WO | 2004/067634 | 8/2004 |
| WO | 2014/203511 | 12/2014 |
| WO | 2018/164833 A1 | 9/2018 |

* cited by examiner

*Primary Examiner* — Camie S Thompson
(74) *Attorney, Agent, or Firm* — GREENBLUM & BERNSTEIN, P.L.C.

(57) ABSTRACT

A polyphenylene ether resin composition includes (A) polyphenylene ether, and (B) a block copolymer including a butadiene block having a molar ratio of a 1,2-bonding structure to a 1,4-bonding structure of 80:20 to 100:0 and a styrene block. The number average molecular weight (Mn) of the component (A) may be 1,000 to 7,000, the weight ratio of the styrene block to the butadiene block in the component (B) may be 10:90 to 80:20, and the weight average molecular weight (Mw) of the component (B) may be 2,000 to 100,000.

10 Claims, No Drawings

POLYPHENYLENE ETHER RESIN COMPOSITION, PREPREG, METAL-CLAD LAMINATE

TECHNICAL FIELD

The present invention relates to a polyphenylene ether resin composition, a prepreg, and a metal-clad laminate plate. The present application claims priority based on Japanese Patent Application No. 2019-144191 filed on Aug. 6, 2019, and Japanese Patent Application No. 2020-031772 filed on Feb. 27, 2020, the content of which is incorporated herein by reference.

BACKGROUND ART

Polyphenylene ether (PPE) has excellent dielectric characteristics such as dielectric constants and dielectric loss tangent, and also has excellent dielectric characteristics in a high-frequency band (high-frequency region) from the MHz band to the GHz band. Thus, the resin composition comprising polyphenylene ether is considered for use as, for example, a molding material for high-frequency applications. When the resin composition is utilized as a molding material such as a substrate material, it is required to have not only excellent dielectric characteristics, but also excellent heat resistance, moldability, water resistance, and the like. Also, a resin composition having excellent thermosetting properties is desired, from the viewpoint of processability.

Patent Document 1 proposes a polyphenylene ether resin composition comprising a specific polyphenylene ether and a cross-linking curing agent. The resin composition described in Patent Document 1 seems to be capable of obtaining a laminate plate having high heat resistance and moldability without reducing dielectric characteristics, even when PPE having a low molecular weight is used to increase the convenience during the production of prepregs.

Patent Document 2 proposes a polyphenylene ether resin composition comprising (A) a modified polyphenylene ether in which a terminal is modified with a substituent having a carbon-carbon unsaturated double bond, (B) a crosslinking agent having a carbon-carbon unsaturated double bond, wherein the crosslinking agent serving as the component (B) comprises 50 to 100% by mass of (B-1) divinylbenzene and (B-2) polybutadiene, the content ratio of the component (A) to the component (B) is component (A):component (B)=65:35 to 95:5 in terms of the mass ratio, and the content ratio of the component (B-1) to the component (B-2) is component (B-1):component (B-2)=1:100 to 1.5:1 in terms of the mass ratio. The resin composition described in Patent Document 2 seems to have excellent characteristics such as heat resistance, adhesiveness, and Tg while maintaining excellent dielectric characteristics.

PRIOR ART DOCUMENTS

Patent Documents

Patent Document 1: Japanese unexamined Patent Application Publication (Translation of PCT Application) No. 2006-516297
Patent Document 2: WO 2014/203511

SUMMARY OF THE INVENTION

Object to be Solved by the Invention

The metal-clad laminate plates produced using conventionally known polyphenylene ether resin compositions sometimes have insufficient heat resistance and water resistance. An object of the present invention is to provide a new polyphenylene ether resin composition capable of producing a metal-clad laminate plate having excellent heat resistance, water resistance, and the like.

Means to Solve the Object

The present inventors have intensively studied to solve the above problems, and as a result, found out a polyphenylene ether resin composition comprising (A) polyphenylene ether, (B) a block copolymer comprising a butadiene block having a molar ratio of a 1,2-bonding structure to a 1,4-bonding structure of 80:20 to 100:0 and a styrene block, and a polyphenylene ether resin composition comprising (A) polyphenylene ether, and (B) a styrene-butadiene-styrene block copolymer (SBS) having a molar ratio of a 1,2-bonding structure to a 1,4-bonding structure in a butadiene block of 80:20 to 100:0. In addition, the present inventors have found out a prepreg in which the polyphenylene ether resin composition of the present invention is impregnated in a base material, and a metal-clad laminate plate produced by laminating the prepreg and a metal foil by hot press molding.

That is, the present invention encompasses the following aspects.

(1) A polyphenylene ether resin composition comprising (A) polyphenylene ether, and (B) a block copolymer comprising a butadiene block having a molar ratio of a 1,2-bonding structure to a 1,4-bonding structure of 80:20 to 100:0, and a styrene block.

(2) A polyphenylene ether resin composition comprising (A) polyphenylene ether, and (B) a styrene-butadiene-styrene block copolymer (SBS) having a molar ratio of a 1,2-bonding structure to a 1,4-bonding structure in a butadiene block of 80:20 to 100:0.

(3) The polyphenylene ether resin composition according to (1) or (2), wherein a number average molecular weight (Mn) of the component (A) is 1,000 to 7,000.

(4) The polyphenylene ether resin composition according to any one of (1) to (3), wherein a weight ratio of the styrene block to the butadiene block in the component (B) is 10:90 to 80:20.

(5) The polyphenylene ether resin composition according to any one of (1) to (4), wherein a weight average molecular weight (Mw) of the component (B) is 2,000 to 100,000.

(6) The polyphenylene ether resin composition according to any one of (1) to (5), wherein a molecular weight distribution (Mw/Mn) of the component (B) is 1.00 to 3.00.

(7) The polyphenylene ether resin composition according to any one of (1) to (6), wherein a content ratio of the component (A) to the component (B) is component (A):component (B)=5:95 to 95:5 in terms of weight ratio.

(8) The polyphenylene ether resin composition according to any one of (1) to (7), further comprising a cross-linking agent.

(9) The polyphenylene ether resin composition according to (8), wherein a content of the crosslinking agent is 1 to 50% by weight with respect to a total weight of the component (A) and the component (B).

(10) The polyphenylene ether resin composition according to any one of (1) to (9), further comprising a flame retardant.

(11) The polyphenylene ether resin composition according to (10), wherein a content of the flame retardant is 1 to 20% by weight with respect to a total weight of the component (A) and the component (B).

(12) A prepreg wherein the resin composition according to any one of (1) to (11) is impregnated in a base material.

(13) A metal-clad laminate plate produced by laminating the prepreg according to (12) and a metal foil by hot press molding.

Effect of the Invention

By using the polyphenylene ether resin composition of the present invention, a metal-clad laminate plate having excellent heat resistance and water resistance can be produced.

MODE OF CARRYING OUT THE INVENTION (Polyphenylene Ether)

Component (A) used in the present invention is polyphenylene ether. Polyphenylene ether is not particularly limited, as long as it is a polymer having a repeating unit of the following (1).

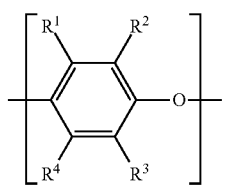
(1)

In formula (1), $R^1$ to $R^4$ each independently is a hydrogen atom, an alkyl group, an alkenyl group, an alkynyl group, an alkylcarbonyl group, or an alkenylcarbonyl group.

As the alkyl group of $R^1$ to $R^4$, a methyl group, an ethyl group, a propyl group, an isopropyl group, or the like may be exemplified.

As the alkenyl group of $R^1$ to $R^4$, a vinyl group, an allyl group, or the like may be exemplified.

As the alkynyl group of $R^1$ to $R^4$, ethynyl, 2-propynyl, or the like may be exemplified.

As the alkylcarbonyl group of $R^1$ to $R^4$, an acetyl group or the like may be exemplified.

As the alkenylcarbonyl group of $R^1$ to $R^4$, an acryloyl group, a methacryloyl group, or the like may be exemplified.

In the polyphenylene ether used in the present invention, the terminal thereof may be modified. As the terminal modified polyphenylene ether, polyphenylene ether the terminal of which is modified with a hydroxyl group, polyphenylene ether the terminal of which is modified with a substituent having a carbon-carbon unsaturated double bond, and polyphenylene ether the terminal of which is modified with a (meth)acryloyl group may be exemplified.

As the substituent having a carbon-carbon unsaturated double bond, a substituent of formula (2) may be exemplified.

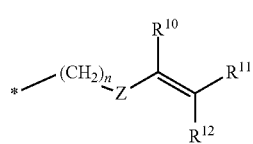
(2)

In formula (2), n is an integer of 0 to 10, Z is an arylene group, $R^{10}$ to $R^{12}$ each independently is a hydrogen atom or an alkyl group, and is a binding portion.

As the alkyl group of $R^{10}$ to $R^{12}$, a methyl group, an ethyl group, a propyl group, an isopropyl group, or the like may be exemplified.

As the arylene group of Z, a phenylene group, or the like may be exemplified.

As the group of formula (2), specifically, structures of formula (2a) and formula (2b) may be exemplified.

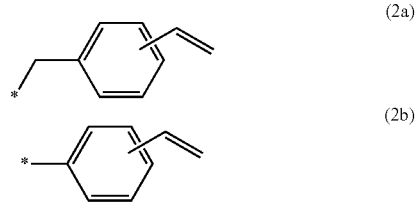

In formula (2a) and formula (2b), represents a binding portion.

The number average molecular weight (Mn) of the polyphenylene ether used in the present invention is not particularly limited, but 1,000 to 100,000, 1,000 to 50,000, 1,000 to 30,000, 1,000 to 7,000, 1,000 to 5,000, 1,000 to 3,000, or the like may be exemplified. The number average molecular weight (Mn) is the value measured using gel permeation chromatography (GPC).

As the intrinsic viscosity of the polyphenylene ether used in the present invention, 0.03 to 0.12 dl/g, 0.04 to 0.11 dl/g, 0.06 to 0.095 dl/g, or the like may be exemplified. The intrinsic viscosity is the intrinsic viscosity measured in methylene chloride at 25° C. More specifically, it is the value obtained by measuring a 0.18 g/45 ml methylene chloride solution (solution temperature: 25° C.) with a viscometer.

As the polyphenylene ether used in the present invention, known one or a commercial product may be used. In the case of synthesis, the polyphenylene ether may be synthesized by the method described in, for example, WO 2014/203511, or a method analogous thereto.

(Block Copolymer Comprising Butadiene Block and Styrene Block)

Component (B) used in the present invention is a block copolymer comprising a butadiene block and a styrene block. The styrene block is a block obtained by polymerizing styrene, and the butadiene block is a block obtained by polymerizing butadiene. As the block copolymer comprising a butadiene block and a styrene block, a styrene-butadiene block copolymer (SB), a styrene-butadiene-styrene block copolymer (SBS), a butadiene-styrene-butadiene block copolymer (BSB), or the like may be exemplified. Among these, the styrene-butadiene-styrene block copolymer (SBS) is preferable.

The butadiene block consists only of the 1,2-bonding structure of formula (3), or consists of the 1,2-bonding structure of formula (3) and the 1,4-bonding structure of formula (4).

(3)

$$-\!\!+\!\!CH_2-HC=\!\!CH-CH_2+\!\!- \qquad (4)$$

The molar ratio of the 1,2-bonding structure of formula (3) to the 1,4-bonding structure of formula (4) comprised in the butadiene block in the block copolymer comprising the butadiene block and the styrene block used in the present invention is preferably 80:20 to 100:0.

The weight ratio of the styrene block to the butadiene block in the block copolymer comprising the butadiene block and the styrene block is not particularly limited, but 10:90 to 80:20, 10:90 to 70:30, 10:90 to 60:40, 20:80 to 80:20, 30:70 to 80:20, 40:60 to 80:20, or the like may be exemplified. Among these, 10:90 to 80:20, 10:90 to 70:30, or 10:90 to 60:40 is preferable.

The weight average molecular weight (Mw) of the block copolymer comprising the butadiene block and the styrene block is not particularly limited, but 2,000 to 100,000, 2,000 to 80,000, 2,000 to 60,000, 2,000 to 50,000, 2,000 to 40,000, or the like may be exemplified. The molecular weight distribution (Mw/Mn) of the block copolymer comprising the butadiene block and the styrene block is not particularly limited, but 1.00 to 3.00, 1.00 to 2.00, or the like may be exemplified. The weight average molecular weight (Mw) and the molecular weight distribution (Mw/Mn) are measured by gel permeation chromatography (GPC) using polystyrene as a standard substance. The measurement conditions are as follows: a mobile phase: THF (tetrahydrofuran), a mobile phase flow rate: 1 mL/min, a column temperature: 40° C., a sample injection volume: 40 μL, and a sample concentration: 2% by weight.

A method for producing the block copolymer comprising the butadiene block and the styrene block used in the present invention is not particularly limited, but for example, the styrene-butadiene-styrene block copolymer may be produced by the method described in, for example, Japanese unexamined Patent Application Publication No. 1994-192502, Japanese unexamined Patent Application Publication (Translation of PCT Application) No. 2000-514122, and Japanese unexamined Patent Application Publication No. 2007-302901, and a method analogous thereto.

(Polyphenylene Ether Resin Composition)

The polyphenylene ether resin composition of the present invention is a composition comprising polyphenylene ether (PPE) (component (A)), and a block copolymer comprising a butadiene block and a styrene block (component (B)).

The content of the component (A) and the component (B) in the polyphenylene ether resin composition of the present invention is not particularly limited, but an amount in which the weight ratio of the component (A) and the component (B) is 5:95 to 95:5, 10:90 to 95:5, 15:85:95:5, 20:80 to 95:5, 25:75 to 95:5, 30:70 to 95:5, 35:65 to 95:5, 40:60 to 95:5, 45:55 to 95:5, 50:50 to 95:5, 55:65 to 95:5, 60:40 to 95:5, 65:35 to 95:5, 70:30 to 95:5, 70:30 to 90:10, or the like may be exemplified.

(Other Additives)

Other additives may be appropriately added to the polyphenylene ether resin composition of the present invention, within a range not impairing the effects of the present invention. As other additives, an initiator, a crosslinking agent, a flame retardant, an inorganic filler, or the like may be exemplified.

The initiator is not particularly limited. Specifically, benzoyl peroxide, cumene hydroperoxide, 2,5-dimethylhexane-2,5-dihydroperoxide, 2,5-dimethyl-2,5-di(t-butylperoxy) hexine-3, di-t-butyl peroxide, t-butylcumyl peroxide, α,α'-bis(t-butylperoxy-m-isopropyl)benzene, 2,5-dimethyl-2,5-di(t-butylperoxy)hexane, dicumyl peroxide, di-t-butyl peroxyisophthalate, t-butyl peroxybenzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, trimethylsilyl triphenylsilyl peroxide, or the like may be exemplified.

The added amount of the initiator is not particularly limited, but an amount of 0.1 to 10% by weight with respect to the combined amount of the component (A) and the component (B) may be exemplified.

The crosslinking agent is not particularly limited. Specifically, divinylbenzene, triallyl isocyanurate, 1,4-polybutadiene, 1,2-polybutadiene, terminal acrylate-modified polybutadiene, terminal urethane methacrylate-modified polybutadiene, or the like may be exemplified. Among these, triallyl isocyanurate, or polybutadiene having a number average molecular weight (Mn) of about 100 to 4,000 is more preferably used.

When the crosslinking agent is added, the added amount thereof is not particularly limited, but an amount of 1 to 50% by weight with respect to the total weight of the component (A) and the component (B) may be exemplified.

The flame retardant is not particularly limited. Specifically, a halogen-based flame retardant such as a bromine-based flame retardant, a phosphorus-based flame retardant, or the like may be exemplified.

As the halogen-based flame retardant, a bromine-based flame retardant such as pentabromodiphenyl ether, octabromodiphenyl ether, decabromodiphenyl ether, tetrabromobisphenol A, and hexabromocyclododecane, a chlorine-based flame retardant such as chlorinated paraffin, or the like may be exemplified.

As the phosphorus-based flame retardant, a phosphoric acid ester such as a condensed phosphoric acid ester and a cyclic phosphoric acid ester, a phosphazene compound such as a cyclic phosphazene compound, a phosphinate-based flame retardant such as aluminum dialkyl phosphinate, a melamine-based flame retardant such as melamine phosphate and melamine polyphosphate, or the like may be exemplified.

When the flame retardant is added, the added amount thereof is not particularly limited, but an amount of 1 to 20% by weight with respect to the total weight of the component (A) and the component (B) may be exemplified.

As the inorganic filler, silica, alumina, talc, aluminum hydroxide, magnesium hydroxide, titanium oxide, mica, aluminum borate, barium sulfate, calcium carbonate, or the like may be exemplified.

When the inorganic filler is added, the added amount thereof is not particularly limited, but an amount of 10 to 150% by weight with respect to the total weight of the component (A) and the component (B) may be exemplified.

The method for producing the thermosetting composition of the present invention is not particularly limited. For example, a method in which the block copolymer comprising the butadiene block and the styrene block (B) and other components are added to the polyphenylene ether (A) and then kneaded with a kneading machine may be exemplified.

(Prepreg)

When a prepreg is produced, the polyphenylene ether resin composition of the present invention is often used by being prepared in a varnish form to impregnate the composition in a base material (fibrous base material) for forming the prepreg. Such a resin varnish is, for example, prepared as follows.

First, respective components that can be dissolved in an organic solvent are put in the organic solvent for dissolution. At this time, components may be heated, as needed. Thereafter, components that are used as needed and cannot be dissolved in the organic solvent, such as the inorganic filler, are added and dispersed using a ball mill, a bead mill, a planetary mixer, a roll mill, or the like until a predetermined dispersion state is achieved, whereby a resin varnish is prepared.

As a method for producing a prepreg by using the obtained resin varnish, for example, a method in which the obtained resin varnish is impregnated in a fibrous base material and then dried may be exemplified.

As the fibrous base material used for producing the prepreg, specifically, glass fiber cloth, aramid cloth, polyester cloth, glass nonwoven fabric, aramid nonwoven fabric, polyester nonwoven fabric, pulp paper, printer paper, or the like may be exemplified.

The fibrous base material in which the resin varnish is impregnated is heated under desired heating conditions, for example, at 80 to 170° C. for 1 to 10 minutes, to remove the solvent, whereby a prepreg in a semi-cured state (B stage) can be obtained.

(Metal-Clad Laminate Plate)

One or a plurality of the obtained prepregs are stacked, a metal foil such as copper foil is further stacked on both the top and bottom surfaces or on one surface of the prepreg or the prepreg stack, and this is integrally laminated by hot press molding, whereby a double-sided metal-clad or single-sided metal-clad laminate plate can be fabricated.

The hot press conditions may be appropriately set according to the thickness of the laminate plate to be produced, the kind of resin composition of the prepreg, and the like. For example, the hot press conditions may be set such that the temperature is 170 to 210° C., the pressure is 1.5 to 4.0 MPa, and the time is 60 to 150 minutes.

EXAMPLES

Hereinafter, the present invention will be described in detail by way of Examples, but the present invention is not limited to the scope of Examples.

Component (B): Production of Styrene-Butadiene-Styrene Block Copolymer (SBS)

Production Example 1

Into a 500 mL flask, 151.95 g of tetrahydrofuran (hereinafter, abbreviated as THF) and 19.65 g of hexane were added. After the mixture was cooled to −40° C., 2.28 g of n-butyllithium (a hexane solution with a concentration of 15.1% by weight) was added and stirred for 10 minutes, then 11.99 g of styrene was added dropwise, and the reaction was continued for 30 minutes. The solution was measured by gas chromatography (hereinafter, abbreviated as GC) and the disappearance of monomers was confirmed. Then, a mixed solution of 21.44 g of 1,3-butadiene, 23.43 g of THF, and 7.80 g of hexane was added dropwise and the reaction was continued. After the solution was measured by GC and the disappearance of monomers was confirmed, 12.05 g of styrene was added dropwise, and after 30 minutes, 0.51 g of methanol was added to terminate the reaction.

The copolymer obtained was analyzed by gel permeation chromatography (mobile phase: THF, polystyrene standards), and it was confirmed that the weight average molecular weight (Mw) was 24,300 and the molecular weight distribution (Mw/Mn) was 1.28. The copolymer obtained was a copolymer having a composition ratio of PS/PB/PS=25/50/25% by weight. Note that PS means the styrene block and PB means the butadiene block. The same applies hereinafter.

The reaction liquid was washed twice with water, and then the solvent was distilled off. This was reprecipitated in methanol, filtered off, and dried in vacuo to obtain a white powder. The 1,2-bonding structure in the butadiene block calculated by $^1$H-NMR was 93 mol %.

Production Example 2

Into a 500 mL flask, 149.37 g of THF and 17.53 g of hexane were added. After the mixture was cooled to −40° C., 5.21 g of n-butyllithium (a hexane solution with a concentration of 15.1% by weight) was added and stirred for 10 minutes, then 10.47 g of styrene was added dropwise, and the reaction was continued for 30 minutes. The solution was measured by gas chromatography (hereinafter, abbreviated as GC) and the disappearance of monomers was confirmed. Then, a mixed solution of 49.28 g of 1,3-butadiene and 49.28 g of THF was added dropwise and the reaction was continued. After the solution was measured by GC and the disappearance of monomers was confirmed, 10.66 g of styrene was added dropwise, and after 30 minutes, 1.12 g of methanol was added to terminate the reaction.

The copolymer obtained was analyzed by gel permeation chromatography (mobile phase: THF, polystyrene standards), and it was confirmed that the molecular weight (Mw) was 14,200 and the molecular weight distribution (Mw/Mn) was 1.18. The copolymer obtained was a copolymer having a composition ratio of PS/PB/PS=15/70/15% by weight.

The reaction liquid was washed twice with water, and then the solvent was distilled off. This was reprecipitated in methanol, filtered off, and dried in vacuo to obtain a colorless and transparent viscous liquid. The 1,2-bonding structure in the butadiene block calculated by $^1$H-NMR was 94 mol %.

Production Example 3

Into a 500 mL flask, 155.90 g of cyclohexane and 20.10 g of THF were added. The mixture was warmed to 30° C., 1.95 g of n-butyllithium (a hexane solution with a concentration of 15.1% by weight) was added and stirred for 10 minutes, then 7.64 g of styrene was added dropwise, and the reaction was continued for 30 minutes. The solution was measured by gas chromatography (hereinafter, abbreviated as GC) and the disappearance of monomers was confirmed. Then, a mixed solution of 35.07 g of 1,3-butadiene and 35.07 g of cyclohexane was added dropwise and the reaction was continued. After the solution was measured by GC and the disappearance of monomers was confirmed, 7.78 g of styrene was added dropwise, and after 30 minutes, 0.40 g of methanol was added to terminate the reaction.

The copolymer obtained was analyzed by gel permeation chromatography (mobile phase: THF, polystyrene standards), and it was confirmed that the molecular weight (Mw) was 17,400 and the molecular weight distribution (Mw/Mn) was 1.07. The copolymer obtained was a copolymer having a composition ratio of PS/PB/PS=15/70/15% by weight.

The reaction liquid was washed twice with water, and then the solvent was distilled off. This was reprecipitated in methanol, filtered off, and dried in vacuo to obtain a colorless and transparent viscous liquid. The 1,2-bonding structure in the butadiene block calculated by $^1$H-NMR was 89 mol %.

Production Example 4

Into a 5,000 mL flask, 1,212 g of THF and 132 g of hexane were added. After the mixture was cooled to −40° C., 98.58 g of n-butyllithium (a hexane solution with a concentration of 15.1% by weight) was added and stirred for 10 minutes, then 60.50 g of styrene was added dropwise, and the reaction was continued for 15 minutes. The solution was measured by gas chromatography (hereinafter, abbreviated as GC) and the disappearance of monomers was confirmed. Then, a mixed solution of 481.88 g of butadiene, 432.12 g of THF, and 48.08 g of hexane was added dropwise and the reaction was continued. After the solution was measured by GC and the disappearance of monomers was confirmed, 61.13 g of styrene was added dropwise, and after 30 minutes, 16.02 g of methanol was added to terminate the reaction.

The copolymer obtained was analyzed by gel permeation chromatography (mobile phase: THF, polystyrene standards), and it was confirmed that the weight average molecular weight (Mw) was 4,742 and the molecular weight distribution (Mw/Mn) was 1.12. The copolymer obtained was a copolymer having a composition ratio of PS/PB/PS=10/80/10% by weight.

The reaction liquid was washed twice with water, and the solvent was distilled off to obtain a white viscous liquid. The 1,2-bonding structure in the butadiene unit calculated by $^1$H-NMR was 91%.

Example 1

A methacryl-modified polyphenylene ether (SA9000, manufactured by SABIC, Mn=1700), the styrene-butadiene-styrene block copolymer obtained in Production Example 1, triallyl isocyanurate (manufactured by FUJIFILM Wako Pure Chemical Corporation), and dicumyl peroxide (manufactured by Aldrich) were mixed in an amount shown in Table 1 and dissolved in methyl ethyl ketone (hereinafter, referred to as MEK, manufactured by FUJIFILM Wako Pure Chemical Corporation) to obtain a varnish.

Example 2

A varnish was obtained in the same manner as in Example 1, except for using the styrene-butadiene-styrene block copolymer obtained in Production Example 4 instead of the styrene-butadiene-styrene block copolymer obtained in Production Example 1.

Comparative Example 1

A varnish was obtained in the same manner as in Example 1, except for using Ricon181 (manufactured by Cray Valley, styrene-butadiene random copolymer) instead of the styrene-butadiene-styrene block copolymer obtained in Production Example 1.

(Method for Fabricating Sample for Solder Heat-Resistance Test)

4 pieces of glass fiber cloth which were cut into 3 cm squares were sufficiently impregnated with the varnish and heated in an oven at 150° C. for 10 minutes to fabricate prepregs. The rough surface of a copper foil having a thickness of 18 μm was applied to both surfaces of the obtained prepregs. Thereafter, this was sandwiched by polytetrafluoroethylene plates and hot-pressed using a press at 230° C. under conditions of 3-4 MPa for 2 hours to obtain an evaluation substrate (copper-clad laminate plate).

(Solder Heat-Resistance Test)

The solder heat-resistance test was measured in accordance with JIS C 6481. The solder heat resistance was evaluated by immersing the copper-clad laminate plate in solder at 260° C. for 2 minutes and observing the peeling of the copper foil. When no peeling occurred, it was evaluated as "○," and when peeling occurred, it was evaluated as "x." The results are shown in Table 1.

(Method for Fabricating Sample for Measuring Glass Transition Temperature Tg and Electrical Characteristics)

10 pieces of glass fiber cloth which were cut into cm squares were sufficiently impregnated with the varnish and heated in an oven at 150° C. for 10 minutes to fabricate prepregs. 10 pieces of the prepregs obtained were laminated, and this was sandwiched by polytetrafluoroethylene plates and hot-pressed using a press at 230° C. under conditions of 3-4 MPa for 2 hours to obtain an evaluation substrate (laminate plate).

(Measurement of Glass Transition Temperature Tg)

The Tg of the laminate plate was measured by using a dynamic viscoelasticity apparatus "RSA-G2" manufactured by TA Instruments. At this time, dynamic viscoelasticity measurement (DMA) was carried out with a bending module using a 30 mm dual cantilever as a jig at a frequency of 1 Hz, and the temperature at which the tan δ was maximum when the temperature was raised from −50° C. to 270° C. at a temperature rising rate of 5° C./min was determined as Tg. The results are shown in Table 1.

(Heat Resistance Evaluation)

Dynamic viscoelasticity measurement (DMA) was carried out using a dynamic viscoelasticity apparatus "RSA-G2" manufactured by TA Instruments with a bending module using a 30 mm dual cantilever as a jig at a frequency of 1 Hz, and when two cycles of measurements from −50° C. to 270° C. at a temperature rising rate of 5° C./min were carried out, the difference of Tg between the first cycle and the second cycle, ΔTg was evaluated. The temperature at which the tan δ was maximum was determined as Tg. The results are shown in Table 1.

(Dielectric Characteristics)

The relative dielectric constants (Dk) and dielectric loss tangents (Df) of the evaluation substrates at 10 GHz were measured by the resonant cavity perturbation method. Specifically, the relative dielectric constants and dielectric loss tangents of the test substrates at 10 GHz were measured using a network analyzer (MS46122B, manufactured by Anritsu Corporation). The results are shown in Table 1.

TABLE 1

| | | Example 1 | Example 2 | Comparative Example 1 |
|---|---|---|---|---|
| Composition (parts by weight) | SA9000 | 50 | 50 | 50 |
| | Polymer synthesized in Production Example 1 | 10 | | |
| | Polymer synthesized in Production Example 4 | | 10 | |
| | Ricon181 | | | 10 |
| | TAIC | 40 | 40 | 40 |
| | DCP | 2 | 2 | 2 |
| Evaluation | Solder heat resistance | ○ | ○ | ○ |
| | Tg (First cycle)(° C.) | 228.2 | 226.0 | 217.4 |

TABLE 1-continued

|  | Example 1 | Example 2 | Comparative Example 1 |
|---|---|---|---|
| Tg (Second cycle)(° C.) | 229.6 | 232.9 | 236.1 |
| ΔTg | 1.5 | 6.9 | 18.7 |
| Relative dielectric constant (Dk) | 3.98 | 3.91 | 4.20 |
| Dielectric loss tangent (Df) | 0.0060 | 0.0057 | 0.0062 |

These test results revealed that the laminate plate produced by using the composition of the present invention has low ΔTg and excellent heat resistance.

The invention claimed is:

1. A polyphenylene ether resin composition comprising (A) polyphenylene ether, and (B) a styrene-butadiene-styrene block copolymer (SBS) having a molar ratio of a 1,2-bonding structure to a 1,4-bonding structure in a butadiene block of 80:20 to 100:0, wherein a number average molecular weight (Mn) of the component (A) is 1,000 to 5,000, and a weight average molecular weight (Mw) of the component (B) is 2,000 to 100,000.

2. The polyphenylene ether resin composition according to claim 1, wherein a weight ratio of the styrene block to the butadiene block in the component (B) is 10:90 to 80:20.

3. The polyphenylene ether resin composition according to claim 1, wherein a molecular weight distribution (Mw/Mn) of the component (B) is 1.00 to 3.00.

4. The polyphenylene ether resin composition according to claim 1, wherein a content ratio of the component (A) to the component (B) is component (A): component (B)=5:95 to 95:5 in terms of weight ratio.

5. The polyphenylene ether resin composition according to claim 1, further comprising a crosslinking agent.

6. The polyphenylene ether resin composition according to claim 5, wherein a content of the crosslinking agent is 1 to 50% by weight with respect to a total weight of the component (A) and the component (B).

7. The polyphenylene ether resin composition according to claim 1, further comprising a flame retardant.

8. The polyphenylene ether resin composition according to claim 7, wherein a content of the flame retardant is 1 to 20% by weight with respect to a total weight of the component (A) and the component (B).

9. A prepreg wherein the polyphenylene ether resin composition according to claim 1 is impregnated in a base material.

10. A metal-clad laminate plate produced by laminating the prepreg according to claim 9 and a metal foil by hot press molding.

* * * * *